United States Patent
Zhang et al.

(10) Patent No.: US 10,191,801 B2
(45) Date of Patent: *Jan. 29, 2019

(54) ERROR CORRECTION CODE MANAGEMENT OF WRITE-ONCE MEMORY CODES

(71) Applicant: Texas Instruments Incorporated, Dallas, TX (US)

(72) Inventors: Sai Zhang, Urbana, IL (US); Yuming Zhu, Plano, TX (US); Clive Bittlestone, Lucas, TX (US); Srinath Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/678,315

(22) Filed: Aug. 16, 2017

(65) Prior Publication Data

US 2018/0011757 A1 Jan. 11, 2018

Related U.S. Application Data

(63) Continuation of application No. 14/703,714, filed on May 4, 2015, now Pat. No. 9,772,899.

(51) Int. Cl.
*G06F 11/08* (2006.01)
*G11C 29/52* (2006.01)
(Continued)

(52) U.S. Cl.
CPC .............. *G06F 11/08* (2013.01); *G06F 3/064* (2013.01); *G06F 3/0619* (2013.01);
(Continued)

(58) Field of Classification Search
CPC .. G06F 11/08; G06F 11/1076; G06F 11/1004; G06F 11/1072; G06F 11/1016;
(Continued)

(56) References Cited

U.S. PATENT DOCUMENTS 8,245,094 B2 * 8/2012 Jiang ................... G06F 11/1072
711/103
8,780,620 B2 * 7/2014 Jiang ................... G11C 11/5678
365/148

(Continued)

FOREIGN PATENT DOCUMENTS

WO WO2014051611 A1 4/2014
WO WO2014116301 A1 7/2014

*Primary Examiner* — John J Tabone, Jr.
(74) *Attorney, Agent, or Firm* — Kenneth Liu; Charles A. Brill; Frank D. Cimino

(57) ABSTRACT

Disclosed embodiments include an electronic device having a write-once memory (WOM) and a memory controller. The memory controller includes a host interface receiving a data word including first and second symbols, each having at least two bits, a WOM controller that encodes the first and second symbols and outputs a WOM-encoded word including first and second WOM codes corresponding to the first and second symbols, respectively, an error correction code (ECC) controller that encodes the WOM-encoded word and outputs an ECC-encoded word including the first and second WOM codes and a first set of ECC bits corresponding to a first write operation, and a memory device interface that writes the ECC-encoded word the WOM device in the first write operation. Each of the first and second WOM codes include at least three bits with at least two of the at least three bits having the same logic value.

19 Claims, 5 Drawing Sheets

(51) Int. Cl.
*G06F 11/10* (2006.01)
*G06F 3/06* (2006.01)
*G06F 12/02* (2006.01)
*H03M 13/13* (2006.01)

(52) U.S. Cl.
CPC ........ *G06F 3/0673* (2013.01); *G06F 11/1004* (2013.01); *G06F 11/1016* (2013.01); *G06F 11/1048* (2013.01); *G06F 11/1072* (2013.01); *G06F 11/1076* (2013.01); *G06F 12/0246* (2013.01); *G11C 29/52* (2013.01); *H03M 13/13* (2013.01)

(58) Field of Classification Search
CPC ...... G06F 3/0673; G06F 3/064; G06F 3/0619; G06F 12/0246; G11C 29/52; H03M 13/13
USPC .................. 714/766, 752, 758, 781; 711/103
See application file for complete search history.

(56) References Cited

U.S. PATENT DOCUMENTS

| | | | |
|---|---|---|---|
| 8,914,570 B2* | 12/2014 | Balakrishnan | G06F 12/0866 711/103 |
| 9,070,427 B2* | 6/2015 | Sharon | G11C 7/1006 |
| 9,086,955 B2* | 7/2015 | Jiang | G06F 12/0246 |
| 9,772,899 B2* | 9/2017 | Zhang | G06F 11/08 |
| 2003/0140300 A1* | 7/2003 | Chen | G06F 11/1016 714/763 |
| 2009/0132758 A1* | 5/2009 | Jiang | G06F 11/1072 711/103 |
| 2012/0096234 A1* | 4/2012 | Jiang | G11C 11/5678 711/170 |
| 2013/0254466 A1* | 9/2013 | Jiang | G06F 12/0246 711/103 |
| 2013/0268723 A1* | 10/2013 | Jiang | G11C 16/0441 711/103 |
| 2013/0297853 A1* | 11/2013 | Balakrishnan | G06F 12/0866 711/103 |
| 2015/0006791 A1* | 1/2015 | Yoo | G11C 16/10 711/103 |
| 2015/0293716 A1* | 10/2015 | Jiang | H03M 13/13 711/154 |
| 2015/0324253 A1* | 11/2015 | Jiang | G06F 12/0246 714/768 |
| 2016/0224408 A1* | 8/2016 | En Gad | G06F 11/1008 |
| 2016/0328289 A1* | 11/2016 | Zhang | G11C 29/52 |
| 2018/0011757 A1* | 1/2018 | Zhang | H03M 13/13 |

* cited by examiner

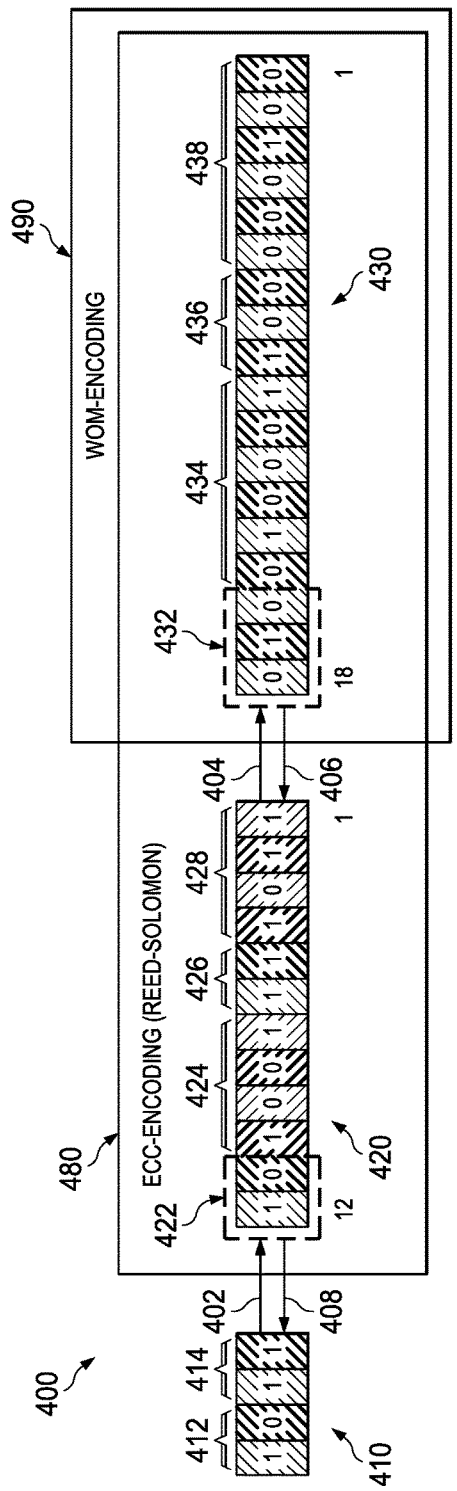
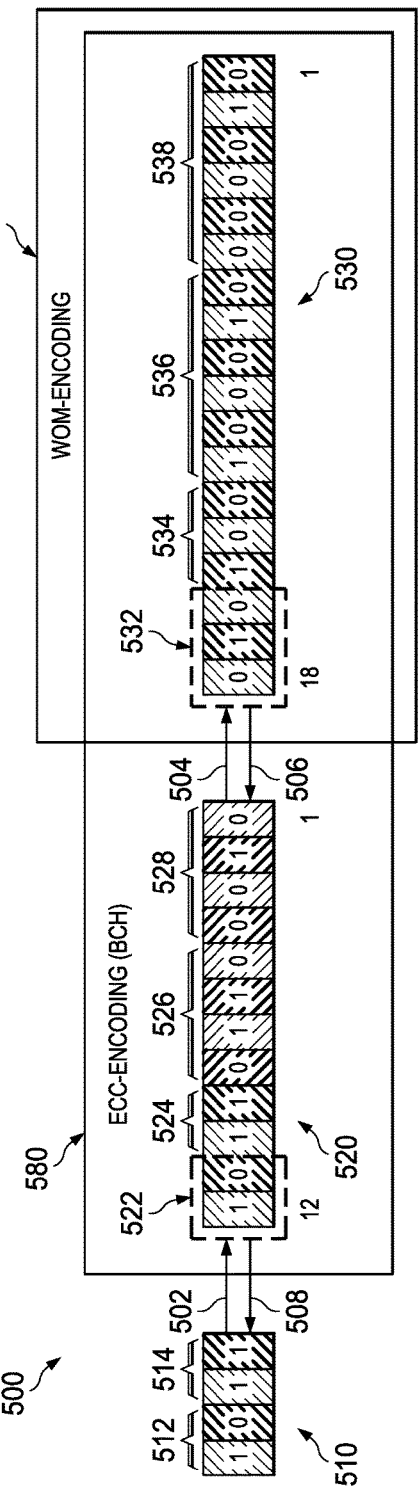
FIG. 4
FIG. 5

ERROR CORRECTION CODE MANAGEMENT OF WRITE-ONCE MEMORY CODES

CROSS-REFERENCE TO RELATED APPLICATION

The present application is a continuation of and claims priority to U.S. patent application Ser. No. 14/703,714, filed May 4, 2015, the entirety of which is incorporated herein by reference.

BACKGROUND

Computer systems include processors that are operable to retrieve, process, and store data in memory devices. The memory devices used in computer systems include different kinds of memory devices, where the different types of memory devices typically have different capabilities and operating characteristics. The type of memory device used in a particular system is typically selected in accordance with the requirements of a particular application of the computer system. For example, some system designs require the ability to write and read data to and from non-volatile memory locations. However, some memory device solutions (such as electrically erasable read-only memories) are unsuited for some applications due to increased cost and decreased performance characteristics.

SUMMARY

The problems noted above can be addressed in a system for error correction code (ECC) management of write-once memory (WOM) codes that includes, for example, a host processor arranged to send a data word that is to be stored in a WOM (Write-Once Memory) device. A host interface is arranged to receive the first data word for processing by a WOM controller and an ECC controller. The WOM controller is for generating a first WOM-encoded word in response to an original symbol of the first data word, while the ECC controller is for generating a first set of ECC bits in response to the original symbol of the first data word. A memory device interface is for writing the first WOM-encoded word and the first set of ECC bits to the WOM device in accordance with the memory address associated with the first data word.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

BRIEF DESCRIPTION OF THE DRAWINGS

FIG. 4 is coding diagram of an example two-stage Reed-Solomon and WOM coding scheme in accordance with embodiments of the disclosure.

FIG. 5 is coding diagram of an example two-stage BCH coding and WOM coding scheme in accordance with embodiments of the disclosure.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
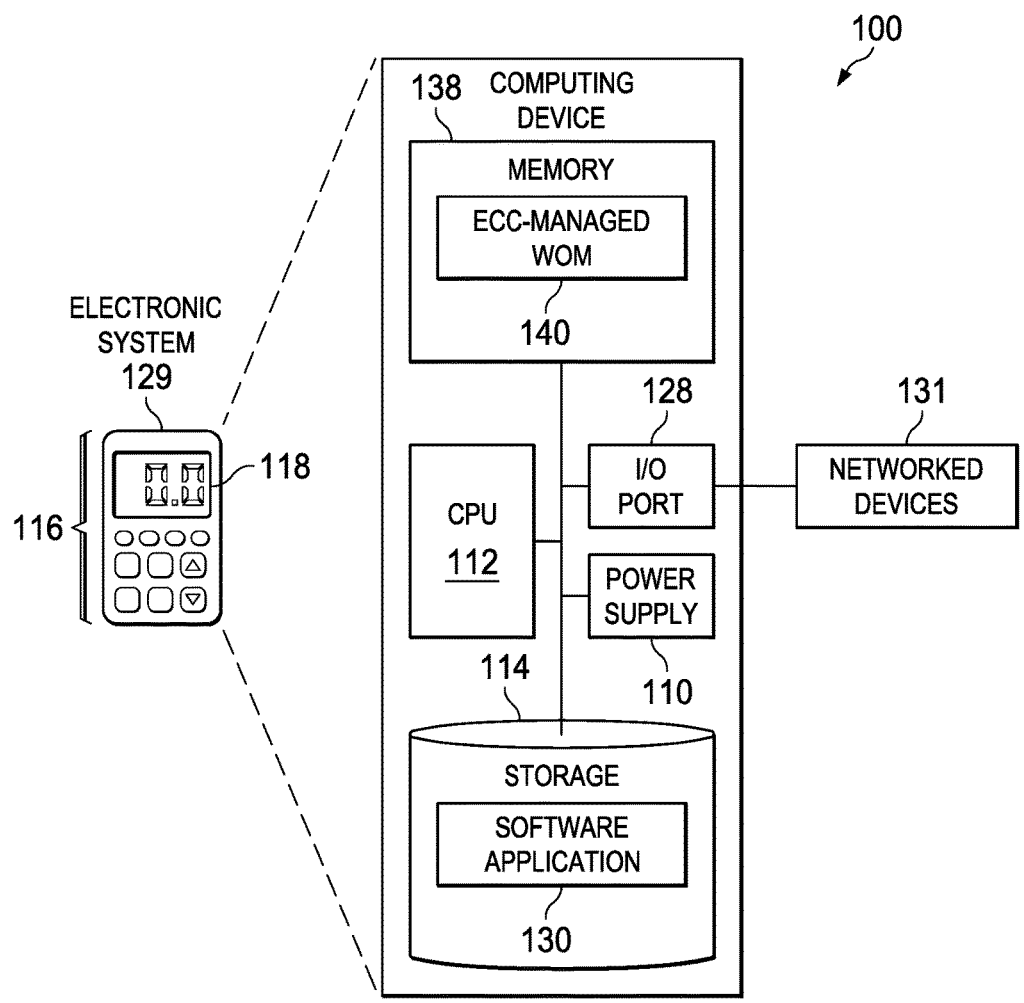
FIG. 1 shows an illustrative computing system in accordance with example embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate radio-frequency signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing system 100.

The CPU 112 comprises memory and logic that store information frequently accessed from the storage 114. The computing system 100 is often controlled by a user using a UI (user interface) 116, which provides output to and receives input from the user during the execution of the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 is coupled to I/O (Input-Output) port 128, which provides an interface that is configured to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using wireless or cabled connections. The CPU 112, storage 114, and power supply 110 can be coupled to an external power supply (not shown) or coupled to a local power source (such as a battery, solar cell, alternator, inductive field, fuel cell, capacitor, and the like).

The computing system 100 includes a memory 138. The memory 138 is suitable for relatively quick memory accesses and is typically formed using solid state memory devices. Such solid-state memory devices include the ECC—(electronic correction code-) managed WOM (write-once memory) 140. The WOM 140 is memory that is typically written once (or a relatively small number of times) before (for example) being discarded or erased. The use of WOM-codes enables certain systems to write and read data to and from non-volatile memory; however, the use of ECC in WOM applications is problematic (as discussed, for example, with respect to FIG. 3).

The ECC-managed WOM 140 write accesses are typically faster than ECC-managed WOM 140 erase cycles (if any) and in an embodiment, the write accesses are capable of changing a bit location in the ECC-managed WOM 140 from an erased state to a written state (such as a "0" to a "1"). The erased state typically depends on a technology selected, and accordingly can be either a "0" or a "1," while the written state is typically the opposite of the erased state. (Some memory devices may store multiple bits of information in a single memory cell in which case the written bits include one or more bits of information that have a state opposite the erased state.)

The ECC-managed WOM 140 is written using a WOM code for efficiently writing to WOM such that the written-to WOM can be written to multiple times without erasure. The ECC-managed WOM 140 can be used to provide cost-efficient non-volatile memory (NVM) having a limited reprogramming capability and/or an enhanced number of write/erase cycles (e.g., as compared with conventional NVM solutions).

Figure 2:
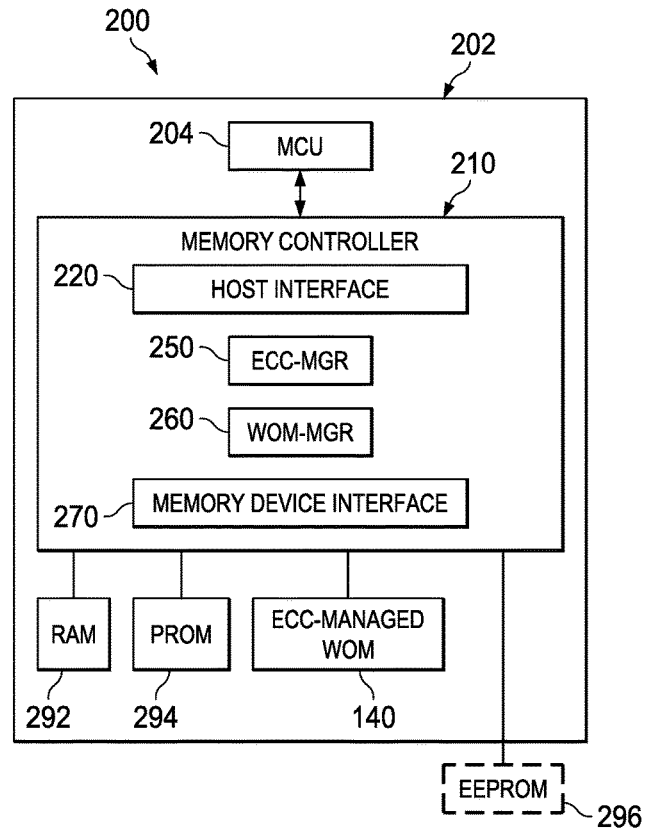
FIG. 2 is a block diagram of a processing system including an ECC-managed WOM in accordance with embodiments of the disclosure.

FIG. 2 is a block diagram of a processing system including an ECC-managed WOM in accordance with embodiments of the disclosure. Generally described, a processing system 200 includes an MCU 204 and a memory controller 210. The MCU 204 and the memory controller 210 are typically arranged on a common substrate 202. The memory controller 210 is communicatively coupled to the MCU 204 and is operable to manage memory accesses to memory devices to (at least) the ECC-managed WOM 140 as well as memory devices such as RAM 292, PROM (programmable read-only memory) 294, and optional EEPROM (electrically erasable read-only memory) 296 (which is optionally formed using a substrate that is different from the substrate 202).

In operation, memory accesses serviced by the memory controller 210 include write operations and read operations. In general, the data of write operations is transmitted in a top-to-bottom direction as illustrated in FIG. 2, while the data of read operations is transmitted in a bottom-to-top direction as illustrated in FIG. 2. Accordingly, the host interface 220 is arranged to select (e.g., in response to a system address supplied with a memory access command) a memory device to write data to or read data from.

The memory controller 210 includes an ECC controller such as ECC-manager 250. During write operations, the ECC-manager 250 is operable to apply an error correction code to data for writing to the ECC-managed WOM 140. During read operations, the ECC-manager 250 is operable to evaluate the retrieved data and, if indicated, the ECC-controller is operable to execute a corrective action in response to the evaluation. For example, the corrective action is operable to correct the retrieved data using ECC-encoded data read from the ECC-managed WOM 140 via the WOM-manager 260.

The memory controller 210 includes the WOM-manager 260. During write operations, the WOM-manager 260 is operable to encode data (e.g., data encoded by the ECC-manager 260 using an ECC encoding) using a WOM code for writing the WOM (and ECC) encoded data to the ECC-managed WOM 140. During read operations, the WOM-manager 260 is operable to decode the WOM-encoded data from the ECC-managed WOM 140. After the WOM-encoded data is decoded, the decoded data is transmitted to the ECC-manager 250 to be further decoded in accordance with the ECC-encoding that was used to originally encode the data written to the ECC-managed WOM 140.

The memory controller 210 includes the memory device interface 270. During write operations, the memory device interface 270 is operable to write the encoded data (e.g., data encoded by the ECC-manager 260 using an ECC encoding and by the WOM-manager 260 using a WOM code) to the ECC-managed WOM 140. During read operations, the memory device interface 270 is operable to read the encoded data from the ECC-managed WOM 140. The memory device interface 270 is also operable to perform block initialization routines on the ECC-managed WOM 140 (e.g., to block erase the ECC-managed WOM 140 such that addressed memory locations are all erased to a logic-zero state.) Typically, the block initialization routines require more time to execute than the execution time required by (e.g., normal) read or write cycles to the ECC-managed WOM 140.

In other embodiments (such as discussed below with reference to FIG. 6), the WOM manager 260 is operable to encode payload data as WOM-encoded data such that the ECC-manager 250 encodes the WOM-encoded data. Likewise, the ECC-manager 250 is operable to decode ECC-encoded data retrieved from memory such that the WOM-manager 260 decodes the WOM-encoded data to retrieve the originally encoded payload data.

WOM encoding can be accomplished using n-bit (e.g., any integer number of bits that is greater than or equal to 2)

symbols that are written to WOM memory a limited number of times. For example, TABLE 1 below illustrates WOM encoding for 2-bit symbols that can be written to WOM twice (e.g., before memory erasure is required) in a particular memory location.

TABLE 1

| 2-bit Symbol | 3-bit WOM Code (1$^{st}$ writing) | 3-bit WOM Code (2$^{nd}$ writing) |
|---|---|---|
| 00 | 000 | 111 |
| 01 | 100 | 011 |
| 10 | 010 | 101 |
| 11 | 001 | 110 |

Each row of TABLE 1 illustrates a 2-bit symbol (e.g., such that $m_{WOM}=2$, where $m_{WOM}$ is the number of bits per symbol) that is WOM-encoded into a 3-bit field. (As discussed above, values for $m_{WOM}$ can be any integer greater than or equal to 2.) When the WOM-encoded data is written to WOM memory a first time, one bit (e.g., at most) is set in the encoded data. When the WOM-encoded data is written to WOM memory a second time, the WOM memory is normally only updated when the new data is different from the previously stored data.

For example, if the WOM memory after first write is "000" and the new data for second write is "00," the WOM memory after second write remains "000." If the WOM memory is written for the second time (e.g., with a value changed from the value written during the first write), at least two (of the three) bits are set in the encoded data. Accordingly, the WOM-manager 260 is able to determine the number of writes to a WOM location (for storing a WOM-encoded symbol) by reading the data stored in the location (and without, for example, having to rely upon a separate counter for each memory location).

Figure 3:
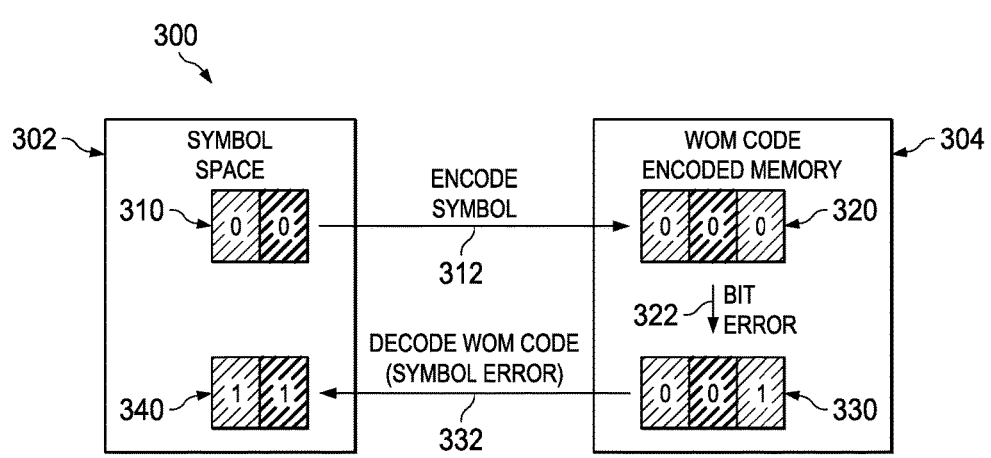
FIG. 3 illustrates symbol-level WOM encoding in an example memory system.

FIG. 3 illustrates symbol-level WOM encoding in an example memory system. Generally described, memory system 300 includes a symbol space 302 and a WOM code encoded memory 304. The symbol space 302 includes a 2-bit symbol 310 having a value (for example) of "00."

In operation 312, the symbol 310 is encoded in accordance with TABLE 1 to generate an encoded symbol 320. (It is understood that the principles and techniques described herein can be used with n-bit symbols and is not limited to 2-bit symbols.) The WOM code encoded memory 304 includes a 3-bit value ("000") 320 for storing the encoded symbol 320 (the default erased bit value "0" for the WOM code encoded memory 304 is used for simplicity of illustration, for example). The WOM code encoded memory 304 is subject to bit errors, which can lead to data loss.

In operation 322, an error occurs in the least significant bit of the memory location 320. Despite the use (or non-use) of error-correction codes in encoded data, single or multiple bit errors are possible in the encoded data: the strength of the error correction codes determines the degree to which errors in the encoded data appear in the decoded data. Accordingly, the 3-bit value 320 is erroneously changed to the 3-bit value ("001") 330, which represents a one-bit error (e.g., in the WOM code encoded memory 304).

In operation 332, the 3-bit value ("001") 330 is read and decoded in accordance with TABLE 1 such that the two-bit symbol 340 (representing the decoded 3-bit value 330) has the value "11." The value "1" in the example represents a two-bit error in the symbol, notwithstanding that only a 1-bit error occurred in the WOM code encoded memory 304. In some example (e.g., "corner") cases, a 1-bit error in a WOM-encoded symbol can result in errors in all bits of the WOM symbol.

The present disclosure includes, for example, two-stage concatenated coding schemes that provide low processing latencies and/or reduced layout requirements for symbol-level protection of data stored in WOM-encoded memory devices. As discussed below with reference to FIG. 4 and FIG. 5, the two-stage concatenated coding schemes include a first stage wherein the payload data is encoded using electronic correction codes (ECC) to produce ECC-protected payload data and a second stage wherein the ECC-protected payload data is encoded using WOM-encoding.

FIG. 4 is a coding diagram of an example two-stage Reed-Solomon and WOM coding scheme in accordance with embodiments of the disclosure. Generally described, data flow diagram 400 includes word 410, ECC-encoded word 420, and WOM-encoded word 430 (having ECC-encoding). The ECC-encoding 480 of the ECC-encoded word 420 is preserved within the WOM-encoding 490 of the WOM-encoded word 430.

Word 410 includes a number of "k" symbols where each symbol is stored in a symbol field such as symbol fields 412 and 414. Each such symbol field is "n" bits (e.g., 2-bits) long. When n=2, then k=2 (e.g., 4/2=2). Accordingly, word 410 includes 2 symbols, where each symbol is respectively stored in symbol field 412 and 414. For example, word 410 includes 4-bits of data, which represent two-symbols of payload data to be encoded (e.g., in accordance with k=2). In various embodiments, the symbol fields include groups of one or more bits, and each group represents a symbol to be encoded. Accordingly, word 410 includes symbol field 412 (for encoding a first symbol) and symbol field 414 (for encoding a second symbol), where each symbol field is to be encoded in encoding operation 402. As illustrated, the symbol field 412 includes the value "10" and the symbol field 414 includes the value "11."

Encoding operation 402 is a first-stage operation that is operable to encode the (e.g., non-encoded) symbol fields of word 410 using a symbol-based error-correcting code scheme such as a Reed-Solomon code. In the Reed-Solomon coding scheme, the parity symbols are used for detecting and optionally correcting errors in an encoded word (where the number of errors that can be corrected depends on how many parity symbols are used). The number of parity symbols used in each RS code is given by 2*T (which is in total 2*$m_{RS}$*T bits), where $m_{RS}$ is the bit-width of each symbol to be encoded and T is the number of correctable errors in the encoded symbol. To ensure the bits for each WOM code are in the same RS symbol, $m_{RS}$ is selected to be an integer multiple of $m_{WOM}$.

In the example discussed herein, $m_{RS}=m_{WOM}$ is chosen for convenience of illustration, where the illustrated error-correction code scheme is capable of correcting single bit errors in a retrieved WOM-encoded word (e.g., where the one-error correction-capable ECC is encapsulated in WOM-encoding). Other embodiments are possible wherein the encapsulated error-correction codes are capable of correcting multiple bit errors (e.g., where each WOM-stored word is capable of correcting for 2 or more errors in the WOM-stored word).

For example, when RS code with T=1 correctable errors is used to encode k=2 symbols, encoding operation 402 generates k=2 separate RS codes 420. The ECC-encoded words 420 include symbol field 422 for the first RS code (e.g., which is a direct copy of symbol field 412) and symbol field 426 for the second RS code (e.g., which is a direct copy of symbol field 414). Parity bits (e.g., check bits) field 424 has a length that is determined in accordance with 2*$m_{RS}$*T=4 as described above. Accordingly, the parity field 424 is a set of bits that is 4-bits long and is used to protect the symbol field 422. Likewise the parity field 428 is 4-bits long and is used to protect the symbol field 426. As illustrated, the symbol field 422 includes the value "10," the parity field 424 includes the value "1010" (which is an example RS encoding of the symbol field 422), the symbol field 426 includes the value "11," and the parity field 428 includes the value "1011" (which is an example RS encoding of the symbol field 426).

Encoding operation 404 is a second-stage operation WOM-encoding operation (such as discussed above with respect to FIG. 3) and is operable to encode the output of the first-stage operation 402 (e.g., which is an ECC-encoded word) as a WOM-encoded word. For example, encoding operation 404 encodes the ECC-encoded word 420 as a WOM-encoded word 430 (e.g., which maintains the information of the original ECC-encoded word 420). WOM-encoded word 430 includes WOM fields 432, 434, 436, and 438, where the WOM field 432 is the WOM code for symbol field 422, the WOM field 434 is the WOM code for symbol field 424, the WOM field 436 is the WOM code for symbol field 426, and the WOM field 438 is the WOM code for symbol field 428. As illustrated, the WOM field 432 includes the value "010," the WOM field 434 includes the value "010001," the WOM field 436 includes the value "100," and the WOM field 438 includes the value "000100."

Each WOM-encoded word includes a 3-bit (e.g., NWOM=3 width) encoding scheme for each 2-bit to-be-encoded symbol as described above with respect to FIG. 3. As discussed above, the WOM encoding allows the WOM-encoded word (e.g., stored in a WOM memory) to be overwritten multiple times such that execution of relatively slow (and lifecycle-limited) block initialization routines can be reduced, if not avoided all together. The block initialization routines include routines such as a block erasure operation (writing all "zeros" to a nonvolatile memory block or a block presetting operation (writing all "ones" to a nonvolatile block of memory). (The type of block operation is typically determined in accordance with the technology of the memory cells used.)

Decoding operation 406 is a WOM-decoding operation (such as discussed above with respect to FIG. 3) and is operable to decode a WOM-encoded word of an ECC-encoded word as the (e.g., ideally) original ECC-encoded word. For example, operation 406 is a "second stage" operation that "reverses" the encoding of the "second stage" operation 404. Decoding operation 406 decodes the WOM-encoded word 430 to (e.g., ideally) retrieve the ECC-encoded word 420 encoded within the WOM-encoded word 430. The parity fields 424 and 428 are respectively used to validate (e.g., restore) the symbol fields 422 and 426.

Decoding operation 408 is an ECC-decoding operation operable to decode ECC-encoded data as validated data. For example, operation 408 is a "first stage" operation that "reverses" the encoding of the "first stage" operation 402. In operation 408, the parity fields 424 and 428 are respectively used to validate (e.g., restore) the symbol fields 422 and 426. In the event of a one-bit error, the strength (e.g., as determined by type of ECC and the number of correction bits used) of the ECC-encoding is sufficient to correct for the error such that the data of word 410 is restorable. Accordingly, a (e.g., single) bit-error in a WOM-encoded field is correctable after the stored WOM-encoded words are retrieved from memory. (In contrast, for example, a one-bit error in the WOM-encoded word as described above with respect to FIG. 3 can lead to a 2-bit error in a symbol.)

FIG. 5 is coding diagram of an example two-stage BCH coding and WOM coding scheme in accordance with embodiments of the disclosure. Generally described, data flow diagram 500 includes word 510, ECC-encoded word 520, and WOM-encoded word 530 (having ECC-encoding). The ECC-encoding 580 of the ECC-encoded word 520 is preserved within the WOM-encoding 590 of the WOM-encoded word 530.

Word 510 includes a number of "k" symbols where each symbol is stored in a symbol field such as symbol fields 512 and 514. Accordingly, word 510 includes 2 symbols, where each symbol is respectively stored in symbol field 512 and 514. The symbol fields are to be encoded in encoding operation 502. As illustrated, the symbol field 512 includes the value "10" and the symbol filed 514 includes the value "11."

Encoding operation 502 is a first-stage operation that is operable to encode the (e.g., non-encoded) symbol fields of word 510 using a non-binary cyclic error-correcting code scheme such as a BCH code. In the BCH coding scheme, parity symbols are used for detecting and optionally correcting errors in an encoded word. Because each bit error in WOM coded word can result in up to $m_{WOM}$ bits error after decoding, each BCH code is sufficiently able to correct T=$m_{WOM}$ bits error. Accordingly, the number of parity symbols used is given by $m_{WOM}$ (which comprises $m_{BCH}$*$m_{WOM}$ bits) where $m_{BCH}$ is the bit-width of each symbol to be BCH encoded and $m_{WOM}$ is equal to the width of symbol field 522 (which is 2-bits wide). When $m_{BCH}$=2 symbols and $m_{WOM}$=2 correctable errors are used in an encoding operation, 4 parity bits are used to protect each symbol.

Encoding operation 502 generates an ECC-encoded word 520. The ECC-encoded words 520 includes symbol field 522 (e.g., which is a direct copy of symbol field 512) for first BCH code and symbol field 524 (e.g., which is a direct copy of symbol field 514) for second BCH code. Parity bits field 526 has a length that is determined in accordance with $m_{BCH}$*$m_{WOM}$, where $m_{BCH}$=2 and $m_{WOM}$=2. Accordingly, the parity field 526 is 4-bits long and is used to protect (e.g., and correct) the symbol of symbol field 522. Likewise the parity field 528 is 4-bits long and is used to protect the symbol of symbol field 524. As illustrated, the symbol field 522 includes the value "10," the parity field 526 includes the value "0110" (which is a BCH encoding of the symbol field 522), the symbol field 524 includes the value "11," and the parity field 528 includes the value "0010" (which is an BCH encoding of the symbol field 524).

Encoding operation 504 is a second-stage operation WOM-encoding operation (such as discussed above with respect to FIG. 3) and is operable to encode the output of the first-stage operation 502 (e.g., which is an ECC-encoded word) as a WOM-encoded word. For example, encoding operation 504 encodes the ECC-encoded word 520 as a WOM-encoded word 530 (e.g., which maintains the information of the original ECC-encoded word 520). The WOM-encoded word 530 includes WOM fields 532, 536, 534, and 538, where the WOM field 532 is the WOM code for symbol field 522, the WOM field 536 is the WOM code for symbol field 526, the WOM field 534 is the WOM code for symbol field 524, and the WOM field 538 is the WOM code for symbol field 528. As illustrated, the WOM field 532 includes the value "010," the WOM field 536 includes the value "100010," the WOM field 534 includes the value "100," and the WOM field 538 includes the value "000010."

Each WOM-encoded word includes a 3-bit (e.g., NWOM=3 width) encoding scheme for each 2-bit to-be-encoded symbol as described above with respect to FIG. 3. The width of the parity fields 526 and 528 is 4 bits each, such that a 6-bit field (e.g., WOM fields 536 and 538) is used to store each of the WOM-encoded values of the parity fields 526 and 528.

Decoding operation 506 is a WOM-decoding operation (such as discussed above with respect to FIG. 3) and is operable to decode a WOM-encoded word of an ECC-encoded word as the (e.g., ideally) original ECC-encoded word. For example, decoding operation 506 decodes the WOM-encoded word 530 to (e.g., ideally) retrieve the ECC-encoded word 520 encoded within the WOM-encoded word 530.

Decoding operation 508 is an ECC-decoding operation operable to decode ECC-encoded data as validated data. For example, the parity fields 526 and 528 are respectively used to validate (e.g., restore) the symbol fields 522 and 524. In the event of a one-bit error, the strength (e.g., as determined by type of ECC and the number of correction bits used) of the ECC-encoding is sufficient to correct for the error such that the data of word 510 is restorable.

Figure 6:
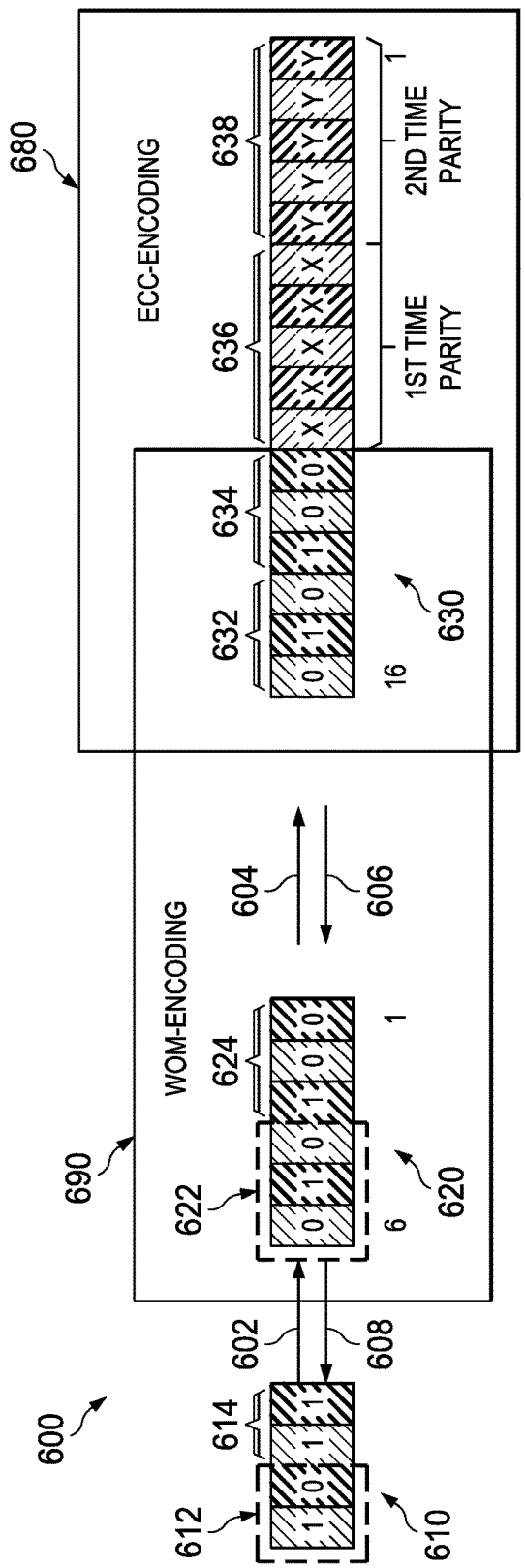
FIG. 6 is coding diagram of an example two-stage WOM coding and ECC coding scheme in accordance with embodiments of the disclosure.

FIG. 6 is a coding diagram of an example two-stage WOM coding and ECC coding scheme in accordance with embodiments of the disclosure. Generally described, data flow diagram 600 includes word 610, WOM-encoded word 620, and ECC-encoded word 630 (having ECC-encoding). The WOM-encoding 690 of the WOM-encoded word 620 is preserved within the ECC-encoding 680 of the ECC-encoded word 630.

Word 610 includes a number of "k" WOM symbols where each symbol is stored in a symbol field such as symbol fields 612 and 614. Accordingly, word 610 includes 2 symbols, where each symbol is respectively stored in symbol field 612 and 614. Accordingly, word 610 includes symbol field 612 (for encoding a first symbol) and symbol field 614 (for encoding a second symbol), where each symbol field is to be encoded in encoding operation 602. As illustrated, the symbol field 612 includes the value "10" and the symbol field 614 includes the value "11."

Encoding operation 602 is a first-stage operation that is operable to encode the (e.g., non-encoded) symbol fields of word 610 using a WOM-encoding operation (such as discussed above with respect to FIG. 3) and is operable to output the encoded symbols as a WOM-encoded word. Each WOM-encoded word includes a 3-bit (NWOM=3 width) encoding scheme for each 2-bit to-be-encoded symbol as described above with respect to FIG. 3 (various embodiments include other ratios such as 4-bit NWOM encoding for each n=2 wide symbol).

For example, encoding operation 602 encodes the word 610 as a WOM-encoded word 620 (e.g., which maintains the information of the word 610). WOM-encoded word 620 includes WOM fields 622 and 624, where the WOM field 622 is the WOM code for symbol field 612 and the WOM field 624 is the WOM code for symbol field 614. As illustrated, the WOM field 622 includes the value "010" and the WOM field 624 includes the value "100."

Encoding operation 604 is a second-stage operation that is operable to encode the WOM-encoded fields of word 620 using linear error-correcting code scheme such as a Hamming or SECDED (single-error correction, double-error detection) code. The example encoding operation 604 operates in accordance with an extended Hamming code. For 6 WOM-coded data bits, a (16,11) extended Hamming code is indicated and accordingly 5 parity bits are used for each write operation. Given the 2-times write capability of the WOM code, 2 sets of 5-bit parity bits are provided, where a different set of 5 parity bits is used for each write operation.

Encoding operation 604 generates an ECC-encoded word 630. The ECC-encoded word 630 includes WOM field 632 (e.g., which is a direct copy of WOM field 622) and WOM field 634 (e.g., which is a direct copy of WOM field 624). Parity field 636 is 5-bits long and is used to protect (e.g., and correct) the symbol of WOM fields 632 and 634 in a first write operation written a particular location of the WOM device. Likewise the parity field 638 is 5-bits long and is used to protect the symbol of WOM fields 632 and 634 for the second write. As illustrated, the WOM field 632 includes the value "010" and the WOM field 634 includes the value "100." For the first write operation to a particular memory location, the parity field 636 includes the value "XXXXX" (which is a first SECDED encoding of the first set of contents of WOM fields 632 and 634). For a second write operation to the particular location of the WOM device, the parity field 638 would include an (e.g., as-of-yet) undetermined value ("YYYYY") that is a second SECDED encoding of the (e.g., arbitrarily) new values of symbol fields 632 and 634. The parity fields 636 and 638 are written, for example, using an encoding (such as "plain" binary) that is different from a WOM-encoding used to encode WOM fields 632 and 634.

Decoding operation 606 is an ECC-decoding operation operable to decode ECC-encoded data as validated data. For example, the parity field 636 is used to validate (e.g., restore) the WOM fields 632 and 634 after a first write operation, while the parity field 638 is used to validate (e.g., restore) the WOM fields 632 and 634 after a second write operation. Accordingly the selection of which parity field to use is made in accordance with a logical analysis of the retrieved contents of the WOM fields 632 and 634 (e.g., as discussed above with respect to Table 1) to determine, for example, whether the particular memory location was written to once or twice. In the event of a one-bit error in the WOM field 632 or the parity fields, 636, the strength of the ECC-encoding is sufficient to correct for the error such that the correct data of WOM field 632 is restorable.

Decoding operation 608 is a WOM-decoding operation (such as discussed above with respect to FIG. 3) and is operable to decode a WOM-encoded word of an ECC-encoded word to retrieve the (e.g., ideally) original ECC-encoded word. For example, decoding operation 608 decodes the WOM-encoded word 620 to (e.g., ideally) retrieve the original data encoded within the WOM-encoded word 620 in encoding operation 602.

Figure 7:
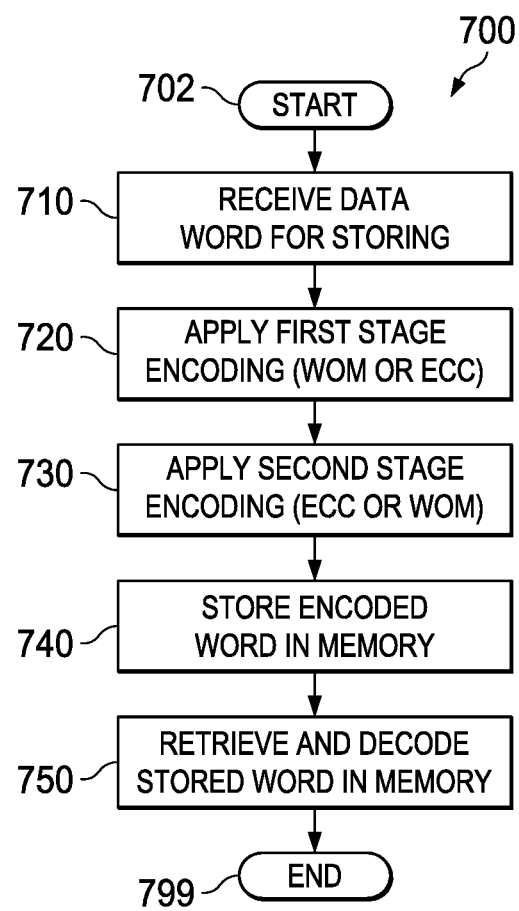
FIG. 7 is an example process flow diagram in accordance with embodiments of the invention.

FIG. 7 is an example process flow diagram in accordance with embodiments of the invention. Process flow begins in terminal 702 where process flow proceeds to operation 710. In operation 710, a data word for storing in a WOM device is received. For example, the first data word includes at least one original symbol encoded as at least two bits, and is associated with a memory address to be written to and read from. Program flow proceeds to step 720.

In operation 720, a first stage of encoding is applied to the received data word. The first stage of encoding is an encoding operation that is a selected one of ECC encoding and WOM encoding. Program flow proceeds to step 730.

In operation 730, a second stage of encoding is applied to the received data word. The second stage of encoding is an encoding operation that is the other operation than the selected one of ECC encoding and WOM encoding. For example, when the first stage operation is a WOM-encoding operation, the second stage is an ECC-encoding operation.

When the first stage operation is an ECC-encoding operation, the second stage is a WOM-encoding operation. Program flow proceeds to step 740.

In operation 740, the twice-encoded word (e.g., that is encoded in stage one and stage two, such that the stage-one encoding is encapsulated by the state-two encoding) is stored in the WOM device. Typically the WOM device is block initialized (with each and every WOM bit set or cleared to the same logic state) and is written to by changing a bit from the block-initialization state to a programmed state (that is the opposite of the block-initialization state). As discussed above, a particular WOM memory location can be overwritten at least once through the use of WOM encoding. Program flow proceeds to step 750.

In operation 750, word stored in the WOM is retrieved, decoded, and the decoded word evaluated. For example, when the WOM-decoded symbol and the ECC bits read from the WOM device indicates an error, an ECC controller is operable to execute a corrective action (e.g., correct a bit error, generate a system interrupt, replace the defective location of the WOM device with a spare storage location, and the like) in response to the evaluation. Program flow proceeds to terminal 799 where program flow terminates.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. An electronic device comprising:
   a write-once memory (WOM) device; and
   a memory controller that includes:
   a host interface to receive a data word including a first symbol and a second symbol, each of the first and second symbols having at least two bits;
   a WOM controller to encode the first symbol and the second symbol and outputs a WOM-encoded word that includes a first WOM code corresponding to the first symbol and a second WOM code corresponding to the second symbol, wherein each of the first and second WOM codes include at least three bits with at least two of the at least three bits having the same logic value;
   an error correction code (ECC) controller to encode the WOM-encoded word and output an ECC-encoded word that includes the first and second WOM codes and a first set of ECC bits corresponding to a first write operation; and
   a memory device interface to write the ECC-encoded word to a first address of the WOM device as part of the first write operation.

2. The electronic device of claim 1, wherein the ECC controller encodes the WOM-encoded word using a Hamming code.

3. The electronic device of claim 1, wherein the ECC controller encodes the WOM-encoded word using a single-error correction, double-error detection (SECDED) code.

4. The electronic device of claim 1, wherein the ECC-encoded word additionally includes a second set of ECC bits corresponding to a second write operation, the second set of ECC bits having an undetermined value prior to completion of the first write operation.

5. The electronic device of claim 4, wherein the second set of ECC bits is determined based on updated values of the first and second WOM codes after the first write operation, and the second set of ECC bits corresponds to a second write operation.

6. The electronic device of claim 5, wherein:
   the first set of ECC bits protects the first and second WOM codes during the first write operation; and
   the second set of ECC bits protects the updated first and second WOM codes during the second write operation.

7. The electronic device of claim 1, wherein each of the first symbol and the second symbol includes a first number of bits, each of the first and second WOM codes includes a second number of bits, and the first set of ECC bits includes a third number of bits that is less than twice the second number of bits.

8. The electronic device of claim 7, wherein the first number of bits is 2, the second number of bits is 3, and the third number of bits is 5.

9. The electronic device of claim 1, wherein the WOM controller encodes every two bits of the data word into a WOM code having at least three bits.

10. A method comprising:
    performing a first write operation to a write-once memory (WOM) device by:
    receiving a data word having first and second symbols, each of the first and second symbols including at least two bits;
    using WOM encoding to encode the first symbol and second symbol and generate a WOM-encoded word including a first WOM code that corresponds to the first symbol and a second WOM code that corresponds to the second symbol, each of the first and second WOM codes including at least three bits with at least two of the at least three bits having the same logic value;
    using error correction code (ECC) encoding to encode the WOM-encoded word and generate an ECC-encoded word that includes the first and second WOM codes, a first set of ECC bits, and a second set of ECC bits, wherein the first set of ECC bits is generated by ECC encoding the first and second WOM codes and corresponds to the first write operation, and wherein the second set of ECC bits has an undetermined value prior to completing the first write operation; and
    writing the ECC-encoded word to the WOM device.

11. The method of claim 10, comprising:
    after the first write operation, performing a second write operation by:
    using error correction code (ECC) encoding to generate an updated ECC-encoded word that includes updated first and second WOM codes, the first set of ECC bits, and the second set of ECC bits, wherein the second set of ECC bits is updated by ECC encoding the updated first and second WOM codes and corresponds to the second write operation; and
    writing the updated ECC-encoded word to the WOM device.

12. The method of claim 11, wherein the first set of ECC bits protects the first and second WOM codes during the first write operation and the second set of ECC bits protects the updated first and second WOM codes during the second write operation.

13. The method of claim 10, wherein each of the first symbol and the second symbol includes a first number of bits, each of the first and second WOM codes includes a second number of bits, and each of the first and second sets of ECC bits includes a third number of bits that is less than twice the second number of bits.

14. The method of claim 13, wherein the first number of bits is 2, the second number of bits is 3, and the third number of bits is 5.

15. The method of claim 13, wherein the ECC encoding is performed using a (16,11) extended Hamming code.

16. The method of claim 10, wherein the WOM encoding produces three bits of WOM code for every two bits of the data word being encoded.

17. The method of claim 10, wherein writing the ECC-coded word to the WOM device comprises changing a block-initialized state of selected bits of the WOM device that correspond to a first address.

18. The method of claim 17, wherein the block-initialized state is a block-erased state.

19. The method of claim 10, comprising:
in response to a request to read the data word from the WOM device after the first write operation but before the second write operation:
using ECC decoding to decode the first and second WOM codes from the ECC-encoded word;
evaluating whether the decoded first and second WOM codes match the first and second WOM codes and, when the decoded first and second WOM codes do not match the first and second WOM codes, using the first set of ECC bits to correct the decoded first and second WOM codes; and
WOM decoding the decoded first and second WOM codes to retrieve the first and second symbols.

* * * * *